United States Patent [19]
Kodama

[11] Patent Number: 5,233,210
[45] Date of Patent: Aug. 3, 1993

[54] NON-VOLATILE MEMORY AND METHOD FOR FABRICATING SAME

[75] Inventor: Noriaki Kodama, Tokyo, Japan

[73] Assignee: NEC Corporation, Tokyo, Japan

[21] Appl. No.: 745,481

[22] Filed: Aug. 14, 1991

[30] Foreign Application Priority Data

Aug. 15, 1990 [JP] Japan .................................. 2-215545

[51] Int. Cl.⁵ ........................ H01L 29/68; H01L 27/10
[52] U.S. Cl. ..................................... 257/315; 257/323; 257/390; 257/401
[58] Field of Search ....................... 357/23.5, 45, 68, 71; 257/315, 323, 390, 401

[56] References Cited

U.S. PATENT DOCUMENTS 5,053,841 10/1991 Miyakawa et al. ................. 357/23.5

OTHER PUBLICATIONS

Katznelson et al., "An Erase Model for FAMOS EPROM Devices," *IEEE Transactions and Electrical Devices*, vol. ED-17, No. 9, Sep. 1980, pp. 1744-1751.

Hisamune et al., "A 3.6 μm² Memory Cell Structure for 16 Mb EPROMS," *IEDM* 89, pp. 583-586.

Primary Examiner—Mark V. Prenty
Attorney, Agent, or Firm—Burns, Doane, Swecker & Mathis

[57] ABSTRACT

A non-volatile memory includes a sheet-shaped source line consisting of a conductive layer. The source line includes an opening at an area including a bit contact area above a drain diffusion layer. The bit contact is formed through self-alignment to the opening of the source line and a control gate electrode. In such a structure, a pitch of the bit contact in the direction parallel to the control gate electrode can be set to be a value twice of the minimum size in design.

2 Claims, 10 Drawing Sheets

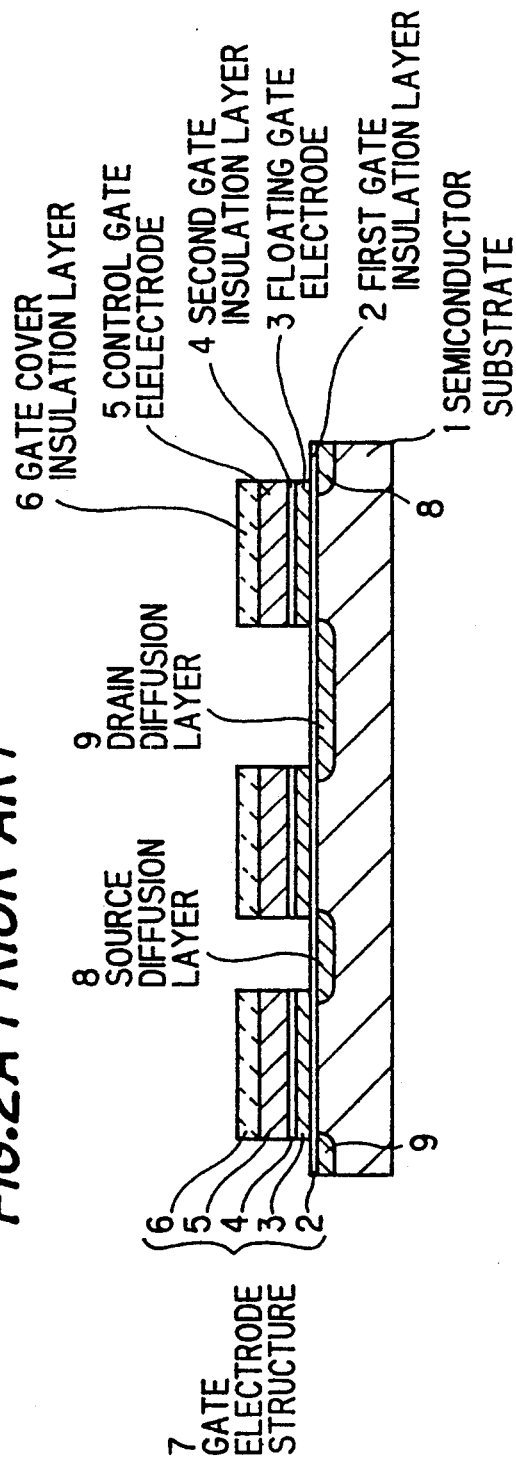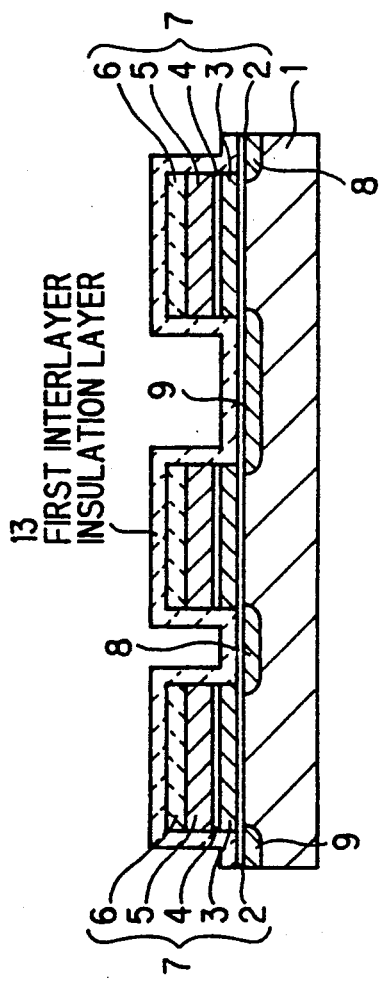
FIG.2A PRIOR ART
FIG.2B PRIOR ART

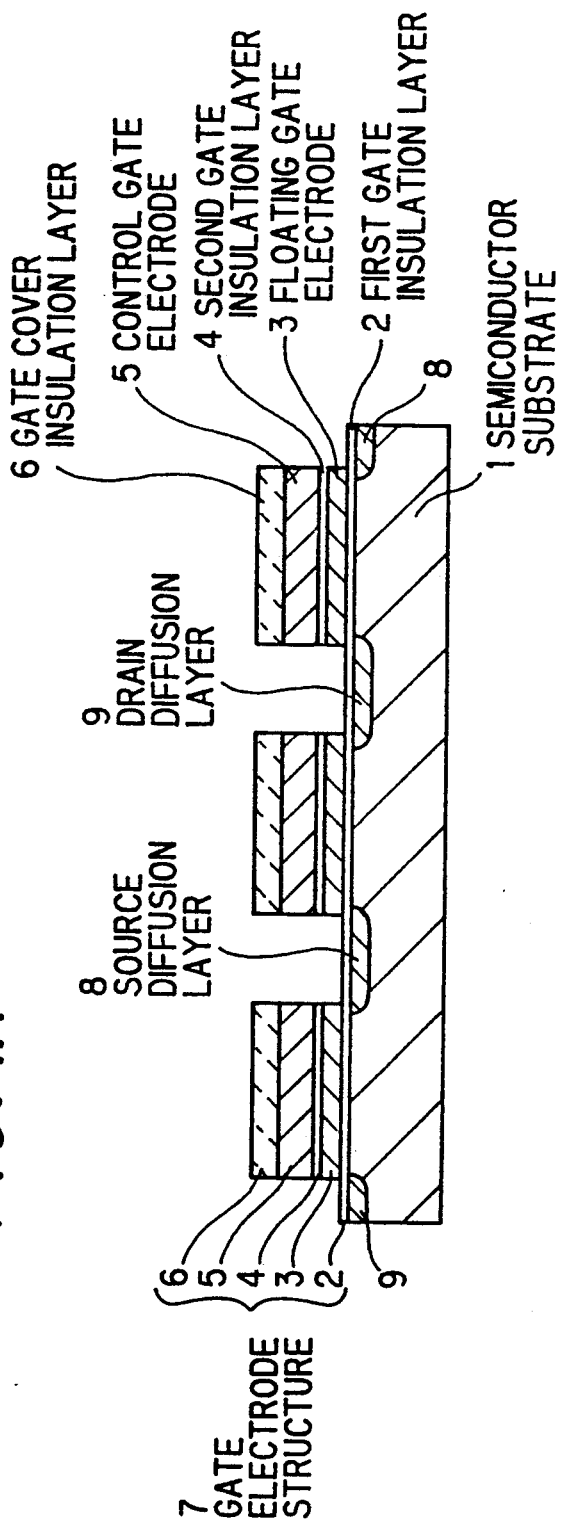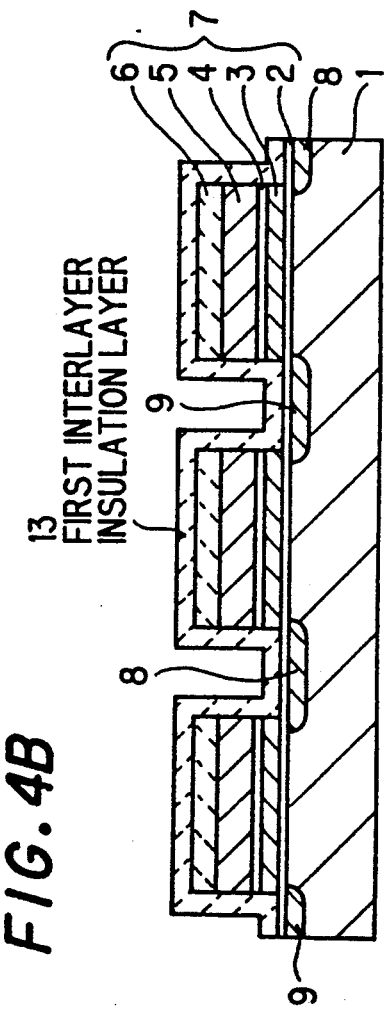

_5,233,210_

NON-VOLATILE MEMORY AND METHOD FOR FABRICATING SAME

FIELD OF THE INVENTION

This invention relates to a non-volatile memory and a method for fabricating same, and more particularly, to a non-volatile memory including a gate electrode structure which includes a floating gate electrode and a control gate electrode, and a method for fabricating same.

BACKGROUND OF THE INVENTION

One conventional non-volatile memory includes a plurality of gate electrode structures each of which includes a floating gate electrode and a control gate electrode. In the non-volatile memory, a plurality of cell arrays is provided in which source diffusion layers are commonly collected at various points corresponding to a few bits of data and source contacts are commonly connected at various points corresponding to a few bits thereof to connect source lines with each other. In such a conventional non-volatile memory, however, exclusive regions for source lines at every point corresponding to a few bits thereof are required, so that the degree the non-volatile memory can be scaled-down is limited.

Recently, an advanced non-volatile memory has been developed in which a plurality of source contacts are provided at each point corresponding to each bit of data, and the source contacts and bit contacts are formed through a self-alignment technique via source and drain diffusion layers. This type of a non-volatile memory has been described at Y. HISAMUNE et al., IEDM Technical Digest, 1989, pages 583–586.

The conventional non-volatile memory includes a plurality of cell array regions arranged in parallel with each other and a plurality of control gate electrodes arranged orthogonally to the cell array regions. Each of the cell array regions includes a plurality of floating gate electrodes, each of which is positioned at each of the crossing points with respect to the control gate electrodes; a plurality of pairs of source and drain diffusion layers, each of the pairs positioned to sandwich each of the control gate electrodes; source contacts, each of which is formed on each of the source diffusion layers; and drain contacts, each of which is formed on each of the drain diffusion layers, both of the contacts are formed through a self-alignment technique via the control gate electrodes.

The conventional non-volatile memory also includes a plurality of source lines arranged in parallel with the control gate electrodes in which each of the source lines is connected with each of the source diffusion layers through each of the source contacts, a plurality of drain pads formed separately above each of the drain diffusion layers to be connected therewith through each of the drain contacts, a plurality of bit contacts formed within each of the drain pads, and a plurality of bit lines arranged in parallel with the cell array regions in which each of the bit contacts is connected with each of the drain diffusion layers through each of the bit contacts and the drain pads, respectively.

According to the conventional non-volatile memory, however, there is a disadvantage in that a scale-down of the cell size thereof is difficult, because the size of the drain pad is required to be considerably large as the bit contact is formed thereon. In more detail, the size l, which is a length of one side of a square of the drain pad is required to fulfill the following relation:

$$l > \lambda + \Delta\lambda + \Delta l + \delta$$

where $\lambda$ is the size of the bit contact (a length one side of a square), $\Delta\lambda$ is a patterning gap between the real size of the bit contact and the pattern size of a mask (extension from the mask pattern), $\Delta l$ is a patterning gap between the real size of the drain pad and the pattern size of the mask (narrowness from the mask pattern), and $\delta$ is the alignment shift of the bit contact to the drain pad. If the gap between the adjacent drain pads is defined as $S_1$, the minimum cell size in the direction parallel to the control gate electrode becomes $l + S_1$. If the size of $\lambda$ and $S_1$ is determined to be the minimum design size $\eta$, the minimum cell size in the direction parallel to the control gate electrode becomes $2\eta + \Delta\lambda + \Delta l + \delta$. Therefore, the degree of scale-down of the cell size is limited by the factors $\Delta\lambda$, $\Delta l$ and $\delta$ which are dependent on the process for fabricating the non-volatile memory.

Furthermore, the source line and the drain pad are required to be formed to over-lap with the control gate electrode in the direction parallel to the bit line, because the source and drain contracts are formed through self-alignment via the control gate electrode. In such a case, since the source line and the drain pad are made of the same conductive thin layer, the gate length L of the control gate electrode is required to fulfill the following relation:

$$L > S_2 + 2\gamma$$

where $\gamma$ is the length of over-lapped regions between the control gate electrode and the source line and between the control gate electrode and the drain pad, and $S_2$ is a gap between the source line and the drain pad. If $S_2$ is determined to be the minimum design size $\eta$, the minimum gate length L of the control gate electrode becomes $\eta + 2\gamma$, so that it is difficult to achieve a gate length L to be the minimum design size $\eta$.

SUMMARY OF THE INVENTION

Accordingly, it is an object of the invention to provide a non-volatile memory and a method for fabricating same in which the degree of scale-down of the cell size is much improved.

According to a first feature of the invention, a non-volatile memory comprises:

a plurality of cell array regions arranged in parallel with each other, each of said cell array regions crossing a plurality of control gate electrodes and including a plurality of floating gate electrodes each of which positioned at each of crossing points with said control gate electrodes, a plurality of pairs of source diffusion layers and drain diffusion layers, each of said pairs positioned to sandwich each of said control gate electrodes, and source contacts each of which is formed on each of said source diffusion layers formed through self-alignment via said control gate electrode;

a source line connected with each of said source diffusion layers through each of said source contacts and which has drain openings at each area including said drain diffusion layers;

A plurality of bit contacts formed within each of said drain openings; and a plurality of bit lines arranged in parallel with said cell array regions, and each of which is connected with each of said drain diffusion layers through each of the bit contacts.

According to a second feature of the invention, a method for fabricating a non-volatile memory comprises the steps of:

forming a plurality of gate electrode structures on a semiconductor substrate, each of said gate electrodes including a first gate insulation layer covering the surface of said semiconductor substrate, a floating gate electrode being formed on said first gate insulation layer, a second gate insulation layer being formed on said floating gate electrode, a control gate electrode being formed on said second gate insulation layer, and a gate cover insulation layer being formed to cover said control gate electrode;

forming a plurality of pairs of source diffusion layers and drain diffusion layers within said semiconductor substrate in the vicinity thereof to sandwich each of said gate electrode structure;

depositing a first interlayer insulation layer covering the surface of the fabricated semiconductor substrate including said gate electrode structures;

forming a photo resist on the surface of said fabricated semiconductor substrate with openings on predetermined positions including areas above said source diffusion layers;

etching anisotropically said first interlayer insulation layer to form side-wall insulation layer on side-walls of said gate electrode structure and source contacts self-alignedly with by using said gate electrode structures;

forming a source line including a conductive thin layer to cover the surface of said fabricated semiconductor substrate including said first interlayer insulation layer;

depositing a second interlayer insulation layer to cover the surface of said fabricated semiconductor substrate including said source line;

forming an opening in said second interlayer insulation layer on said drain diffusion layer to be formed as a bit contact in which said source line is uncovered by using a patterned photo resist as a mask;

removing said source line within said bit contact by etching to form a drain opening;

etching anisotropically said first interlayer insulation layer within said drain opening to form side-wall insulation layers touching said drain diffusion layer on said side-walls of said gate electrode structure and to widen said bit contact to uncover said drain diffusion layer;

depositing a third interlayer insulation layer to cover the surface of said fabricated semiconductor substrate including said second interlayer insulation layer and said opening of said bit contact.

etching anisotropically said second interlayer insulation layer to be etched back to form third side-wall insulation layers on said side-walls of said gate electrode structures and to widen said bit contact to uncover said drain diffusion layer through a self-alignment technique;

forming a contact stuffing layer including a conductive material formed to stuff said bit contact; and forming a bit line to be connected with said drain diffusion layer through said contact stuffing layer.

BRIEF DESCRIPTION OF THE DRAWINGS

The invention will be explained in more detail in conjunction with appended drawings wherein:

FIGS. 2A to 2G are cross-sectional views illustrating the conventional non-volatile memory during various stages of fabrication;

FIGS. 4A to 4I are cross-sectional views illustrating the non-volatile memory during various stages of fabrication.

DESCRIPTION OF THE PREFERRED EMBODIMENTS

Figure 1:
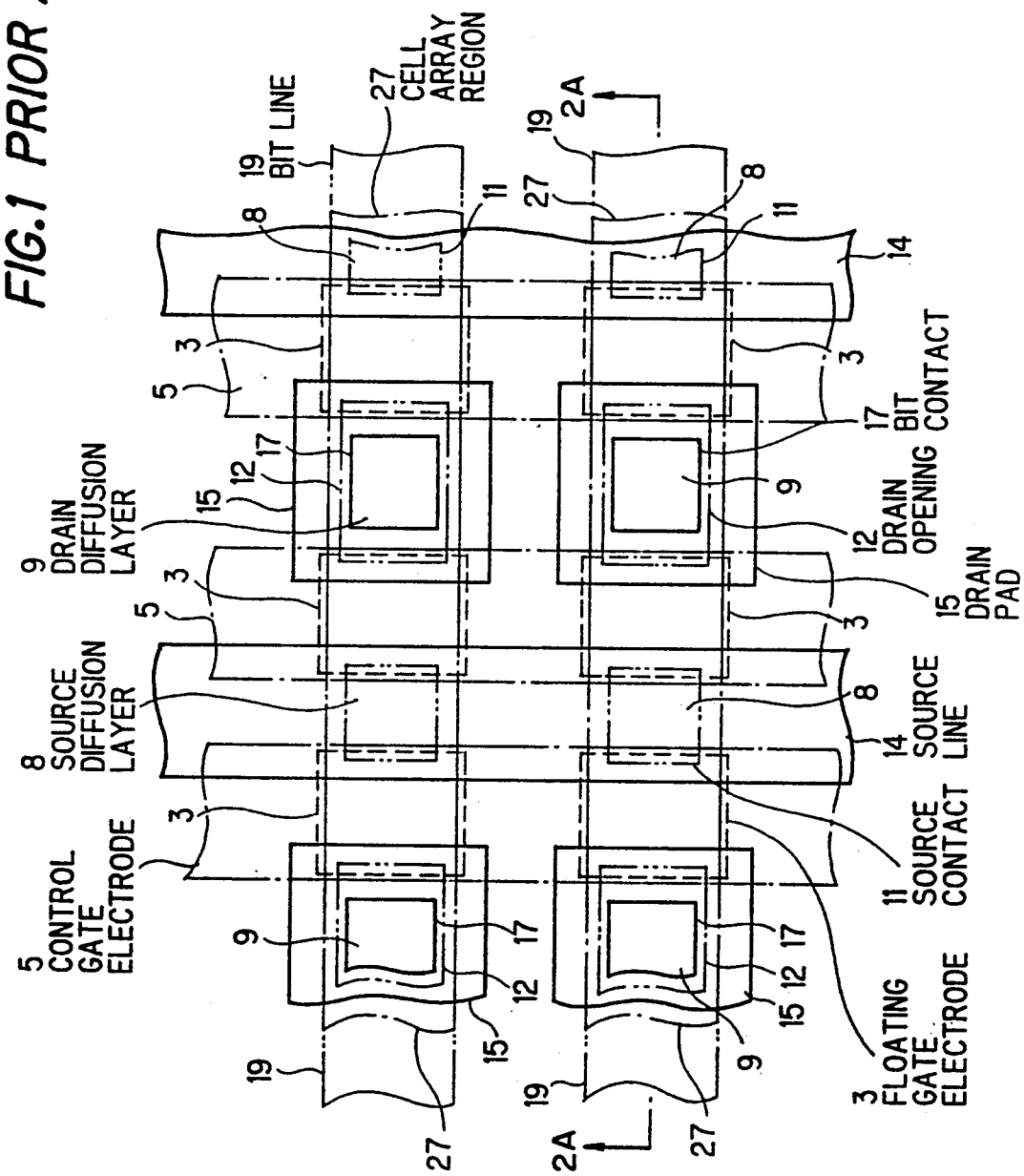
FIG. 1 is a plan view illustrating a schematic design of a conventional non-volatile memory.

Before describing a non-volatile memory in preferred embodiments according to the invention, the conventional non-volatile memory described before will be explained in conjunction with FIG. 1.

The conventional non-volatile memory includes a plurality of cell array regions 27 arranged in parallel with each other and a plurality of control gate electrodes 5 arranged orthogonally to the cell array regions 27. Each of the cell array regions 27 includes a plurality of floating gate electrodes 3 each of which is positioned at each of the crossing points with the control gate electrodes 5, a plurality of pairs of a source diffusion layer 8 and a drain diffusion layer 9 each of the pairs positioned to sandwich or bracket each of the control gate electrodes 5, and source contacts 11 each of which is formed on each of the source diffusion layers 8, and drain contacts 12 each of which is formed on each of the drain diffusion layers 9 both formed through self-alignment via the control gate electrode 5.

The conventional non-volatile memory also includes a plurality of source lines 14 arranged in parallel with the control gate electrodes 5 in which each of the source lines 14 is connected with each of the source diffusion layers 8 through each of the source contacts 11, a plurality of drain pads 15 formed separately above each of the drain diffusion layers 9 to be connected therewith through each of the drain contacts 12, a plurality of bit contacts 17 formed within each of the drain pads 15, and a plurality of bit lines 19 arranged in parallel with the cell array regions 27 in which each of the bit lines 19 is connected with each of the drain diffusion layers 9 through each of the bit contacts 17 and the drain pads 15, respectively.

Figure 2C:
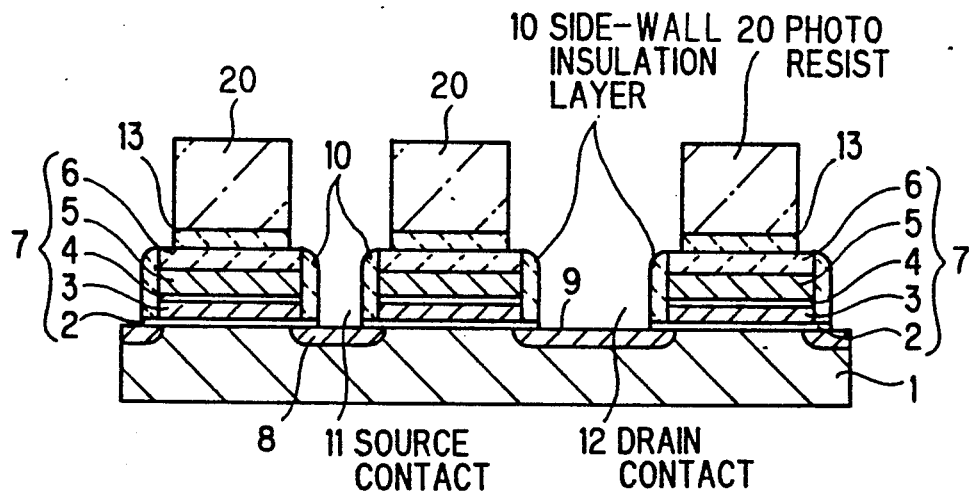

Next, the method for fabricating the conventional non-volatile memory will be explained in conjunction with FIGS. 2A to 2G, which are taken on line A—A in FIG. 1. In FIG. 2A, a plurality of gate electrode structures 7 are formed on a semiconductor substrate 1. Each of the gate electrode structures 7 includes a first gate insulation layer 2 covering the surface of the semiconductor substrate 1, a floating gate electrode 3 formed on the first gate insulation layer 2, a second gate insulation layer 4 formed on the floating gate electrode 3, a control gate electrode 5 formed on the second gate insulation layer 4, and a gate cover insulation layer 6 formed to cover the control gate electrode 5. A plurality of pairs of source diffusion layers 8 and drain diffusion layers 9 are formed within the semiconductor substrate 1 in the vicinity thereof to sandwich or bracket each of the gate electrode structures 7.

Figure 2D:
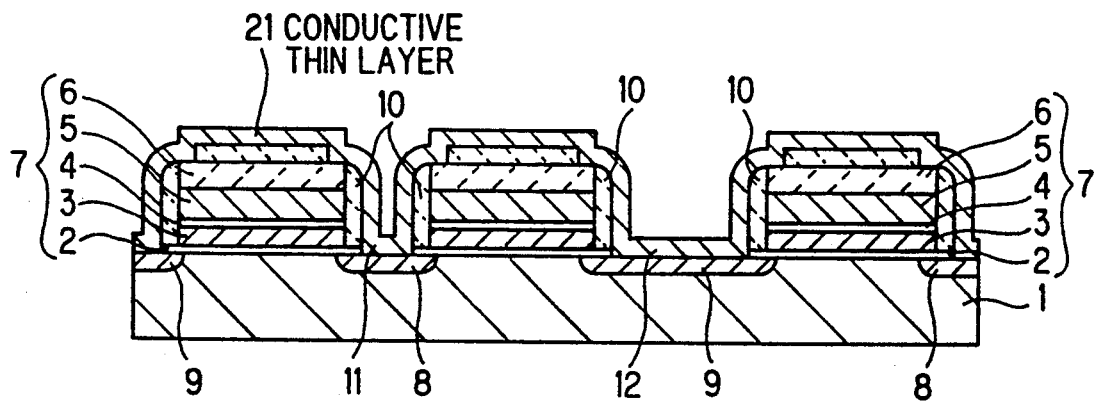
Figure 2E:
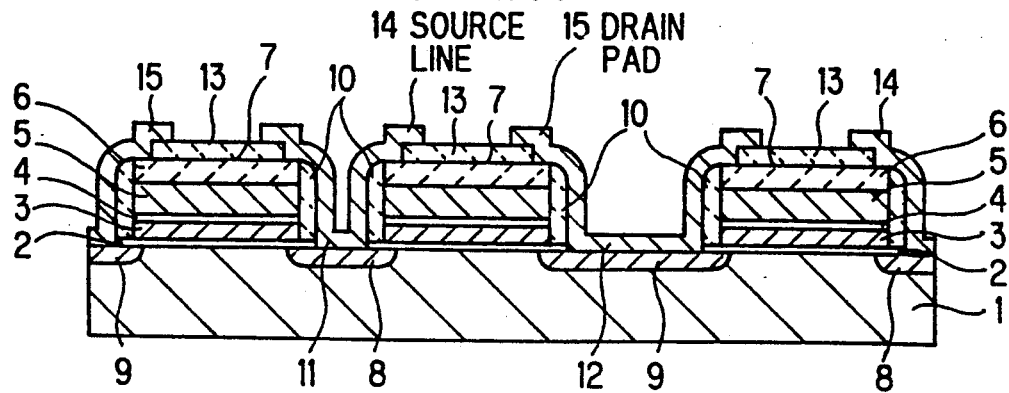
Figure 2F:
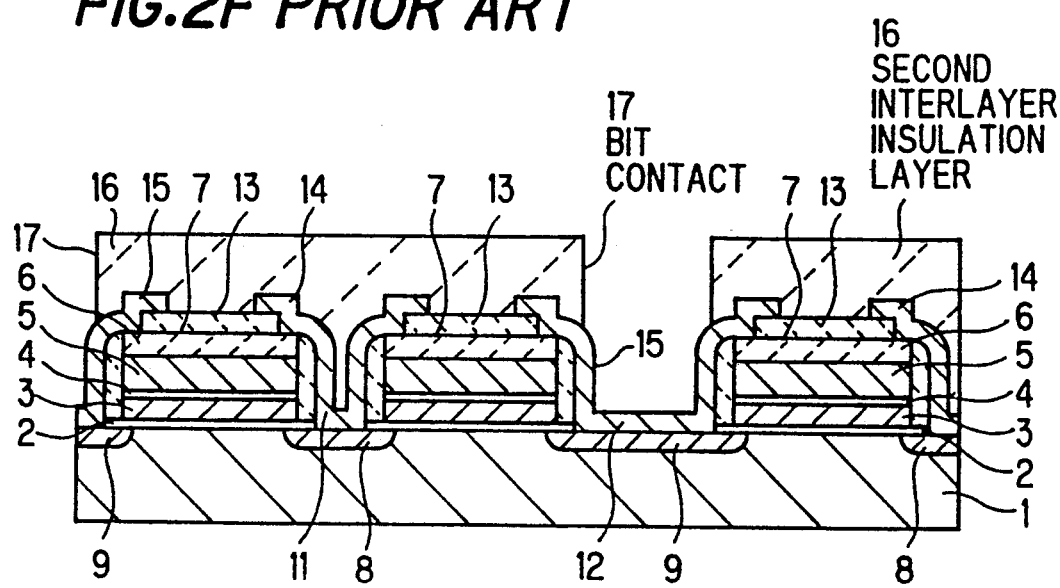
Figure 2G:
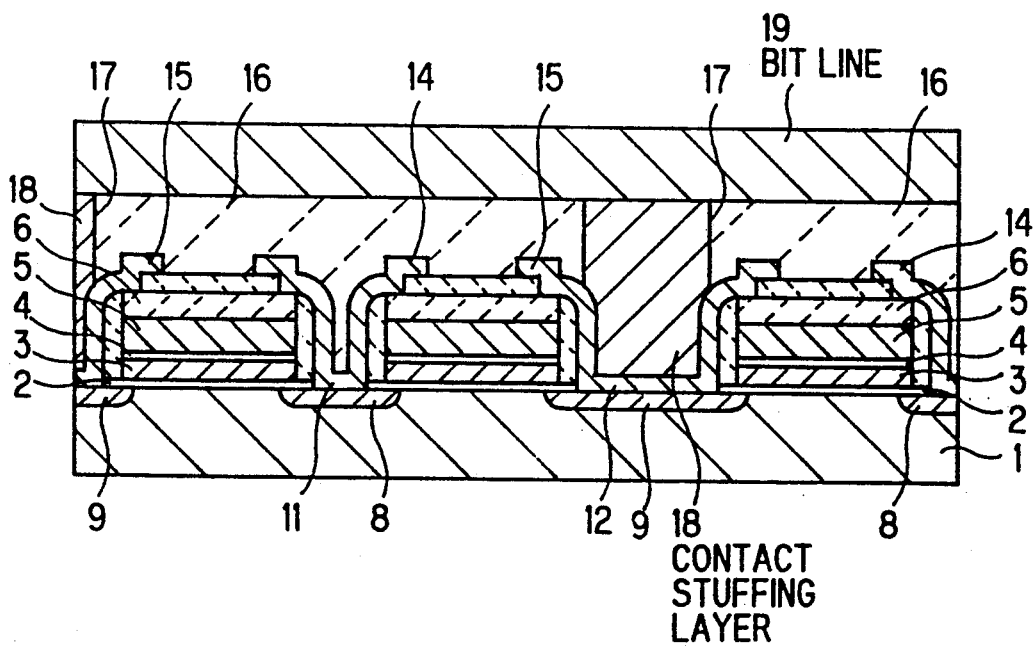

Then, as shown in FIG. 2B, a first interlayer insulation layer 13 is deposited to cover the surface of the fabricated semiconductor substrate 1 including the gate electrode structures 7. Then, a photo resist 20 is formed on the surface of the fabricated semiconductor substrate 1 with openings on predetermined positions including the areas above the source diffusion layers 8 and the drain diffusion layers 9. Then, as shown in FIG. 2C, anisotropic etching of the first interlayer insulation layer 13 is carried out to form side-wall insulation layer 10 on the side-walls of the gate electrode structures 7 and source contacts 11 and drain contacts 12 self-alignedly to the gate electrode structures 7. Then, as shown in FIG. 2D, a conductive thin layer 21 such as a metal silicide is deposited to cover the surface of the fabricated semiconductor substrate 21 including the first interlayer insulation layer 13. Then, as shown in FIGS. 2D and 2E, the conductive thin layer 21 is patterned to form a source line 14 which is to be connected with the source diffusion layer 8 and a drain pad 15 which is to be connected with the drain diffusion layers 9. Then, as shown in FIG. 2F, a second interlayer insulation layer 16 is deposited to cover the surface of the fabricated semiconductor substrate 1 including the source line 14, the drain pad 15 and the first interlayer insulation layer 13, and then an opening is formed in the second interlayer insulation layer 16 on the drain pad 15 to be formed as a bit contact 17. Then, as shown in FIG. 2G, a contact stuffing or filler layer 18 consisting of a conductive material is formed to stuff the bit contact 17, and then a bit line 19 is formed to be connected with the drain diffusion layer 9 through the contact stuffing layer 18 and the drain pad 15.

Figure 3:
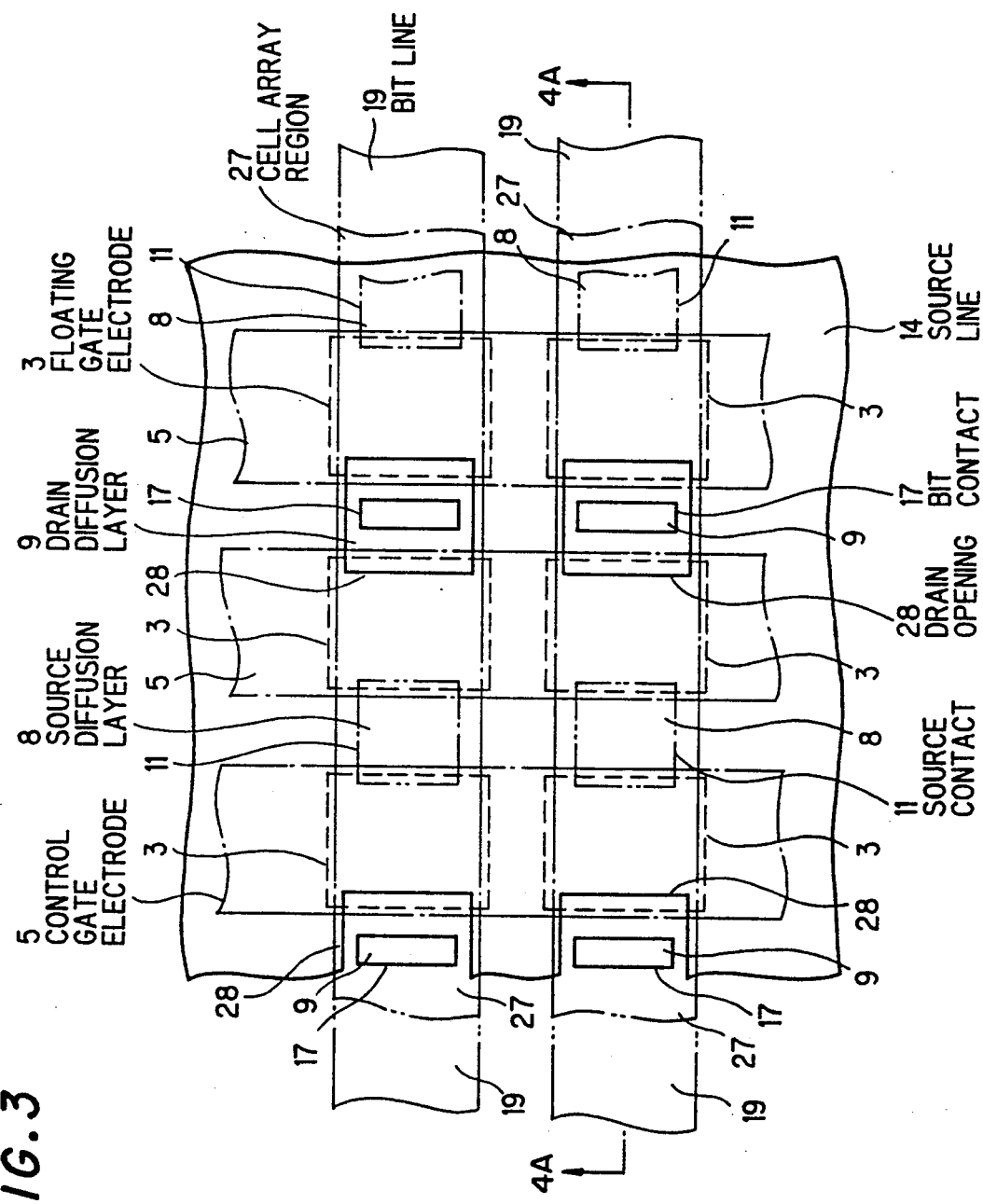
FIG. 3 is a plan view illustrating a schematic design of a non-volatile memory in a first preferred embodiment according to the invention.

Next, a non-volatile memory in a first preferred embodiment will be explained in conjunction with FIG. 3. The conventional non-volatile memory includes a plurality of cell array regions 27 arranged in parallel with each other and a plurality of control gate electrodes 5 arranged orthogonally to the cell array regions 27. Each of the cell array regions 27 includes a plurality of floating gate electrodes 3 each of which is positioned at each of the crossing points with the control gate electrodes 5, a plurality of pairs of a source diffusion layer 8 and a drain diffusion layer 9 each of the pairs positioned to sandwich or bracket each of the control gate electrodes 5, and source contacts 11 each of which is formed on each of the source diffusion layers 8 through a self-alignment technique via the control gate electrode 5.

The non-volatile memory also includes a source line 14 which is connected with each of the source diffusion layers 8 through each of the source contacts 11 and has drain openings 28 at each area including the drain diffusion layers 9, a plurality of bit contacts 17 formed within each of the drain openings 28, and a plurality of bit lines 19 arranged in parallel with the cell array regions 27, and each of which is connected with each of the drain diffusion layers 9 through each of the bit contacts 17.

Next, the method for fabricating the non-volatile memory in the first preferred embodiment will be explained in conjunction with FIGS. 4A to 1I which are taken on line A—A in FIG. 3.

In FIG. 4A, a plurality of gate electrodes structures 7 is formed on a semiconductor substrate 1. Each of the gate electrode structures 7 include a first gate insulation layer 2 covering the surface of the semiconductor substrate 1, a floating gate electrode 3 formed on the first gate insulation layer 2, a second gate insulation layer 4 formed on the floating gate electrode 3, a control gate electrode 5 formed on the second gate insulation layer 4, and a gate cover insulation layer 6 formed to cover the control gate electrode 5. A plurality of pairs of source diffusion layers 8 and drain diffusion layers 9 are formed within the semiconductor substrate 1 in the vicinity thereof to sandwich or bracket each of the gate electrode structures 7.

Figure 4C:
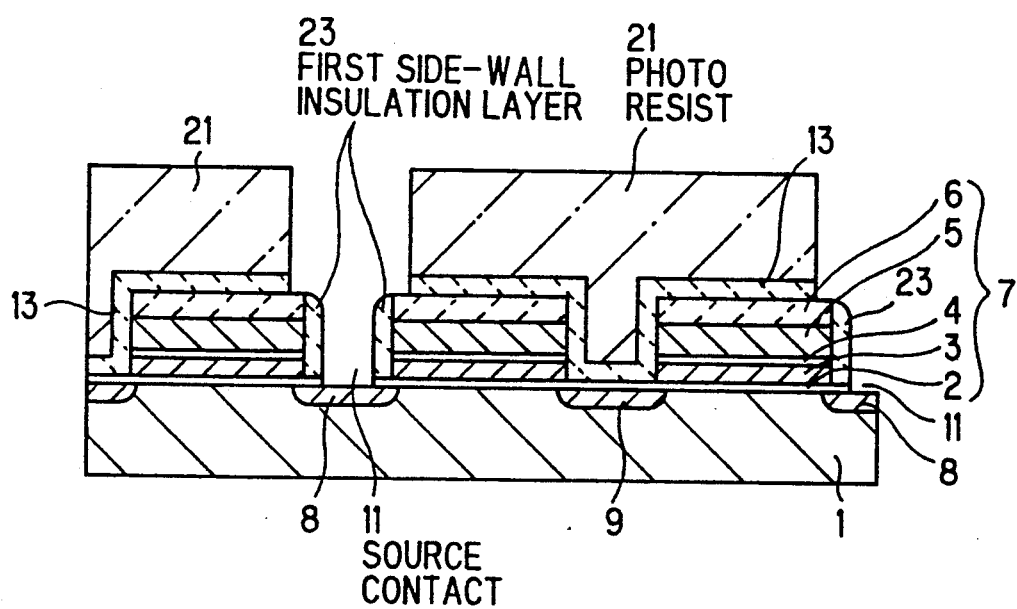
Figure 4D:
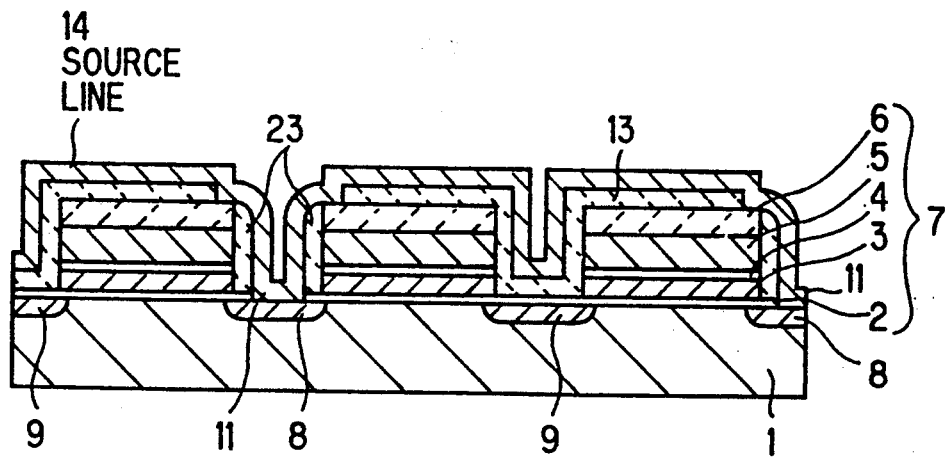
Figure 4E:
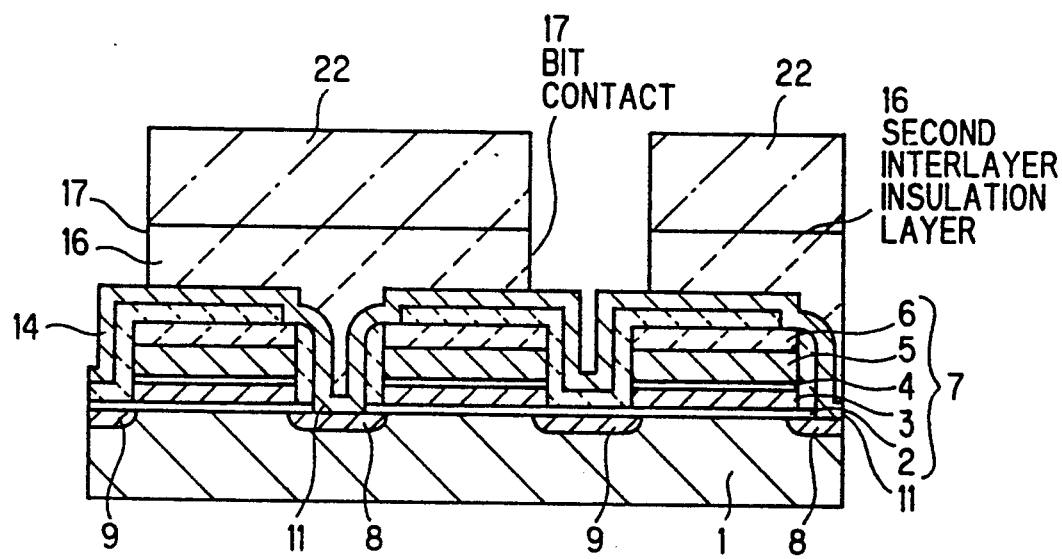
Figure 4F:
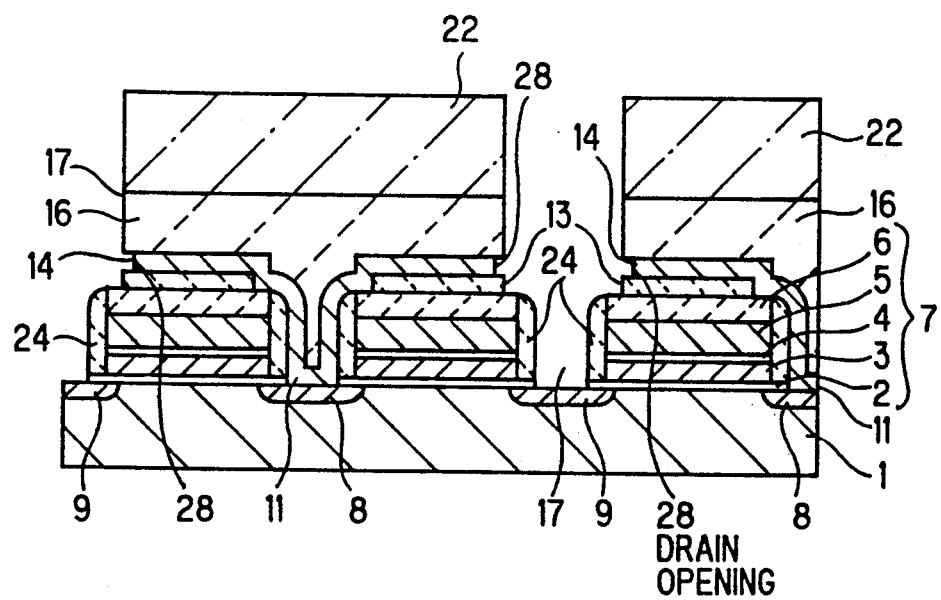

Then, as shown in FIG. 4B, a first interlayer insulation layer 13 is deposited to cover the surface of the fabricated semiconductor substrate 1 including the gate electrode structures 7. Then, a photo resist 21 is formed on the surface of the fabricated semiconductor substrate 1 with openings on predetermined positions including the areas above the source diffusion layers 8. Then, as shown in FIG. 4C, anisotropic etching of the first interlayer insulation layer 13 is carried out to form side-wall insulation layers 23 on the side-walls of the gate electrode structures 7 and source contacts 11 in self-alignment by using the gate electrode structures 7. Then, as shown in FIG. 4E, a source line 14 including a conductive thin layer such as metal silicate is formed to cover the surface of the fabricated semiconductor substrate 1 including the first interlayer insulation layer 13. Then, as shown in FIG. 4E, a second interlayer insulation layer 16 is deposited to cover the surface of the fabricated semiconductor substrate 1 including the source line 14, and then an opening is formed in the second interlayer insulation layer 16 on the drain diffusion layer 9 to be formed as a bit contact 17 in which the source line 14 is uncovered by using a patterned photo resist 22 as a mask. Then, as shown in FIG. 4F, the source line 14 within the bit contact 17 is removed by etching to form a drain opening 28, and then anisotropic etching of the first interlayer insulation layer 13 within the drain opening 28 is carried out to form side-wall insulation layers 24 touching the drain diffusion layer 9 on the side-walls of the gate electrode structures 7 and to widen the bit contact 17 to uncover the drain diffusion layer 9.

Figure 4G:
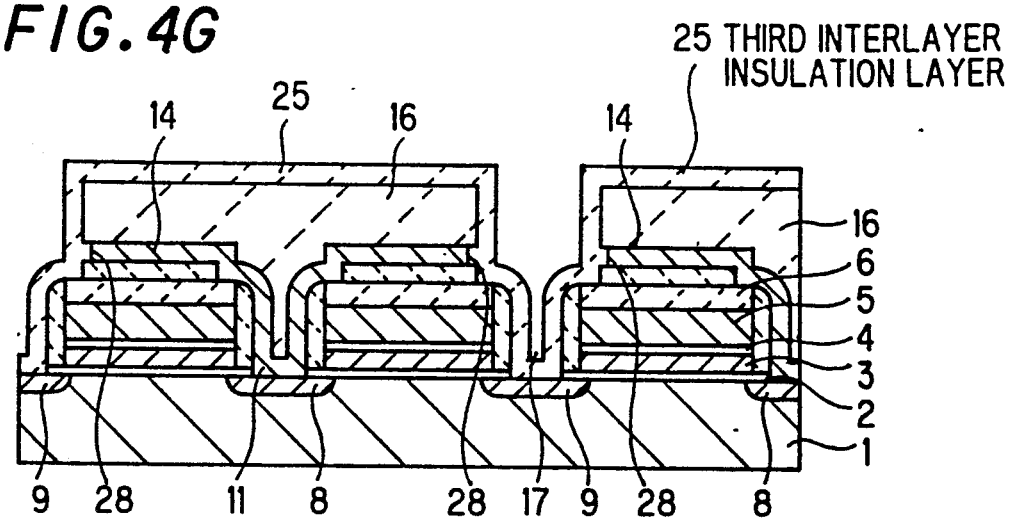
Figure 4H:
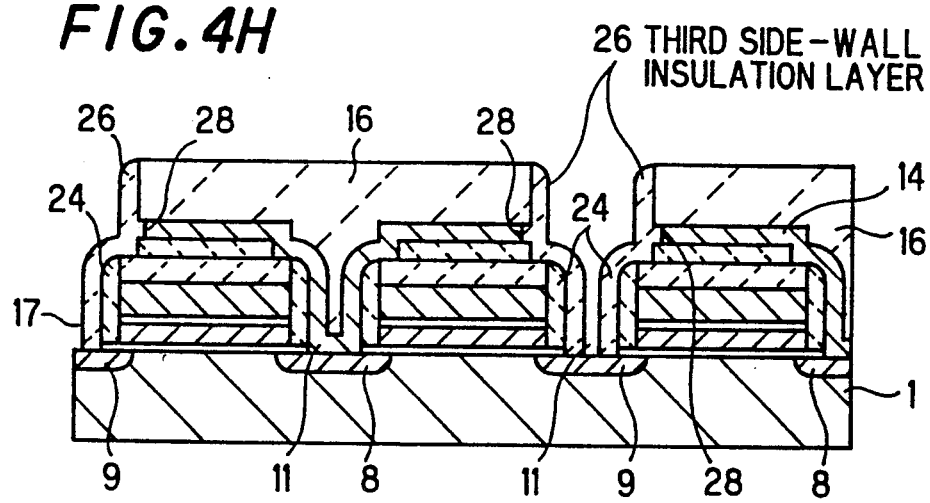
Figure 4I:
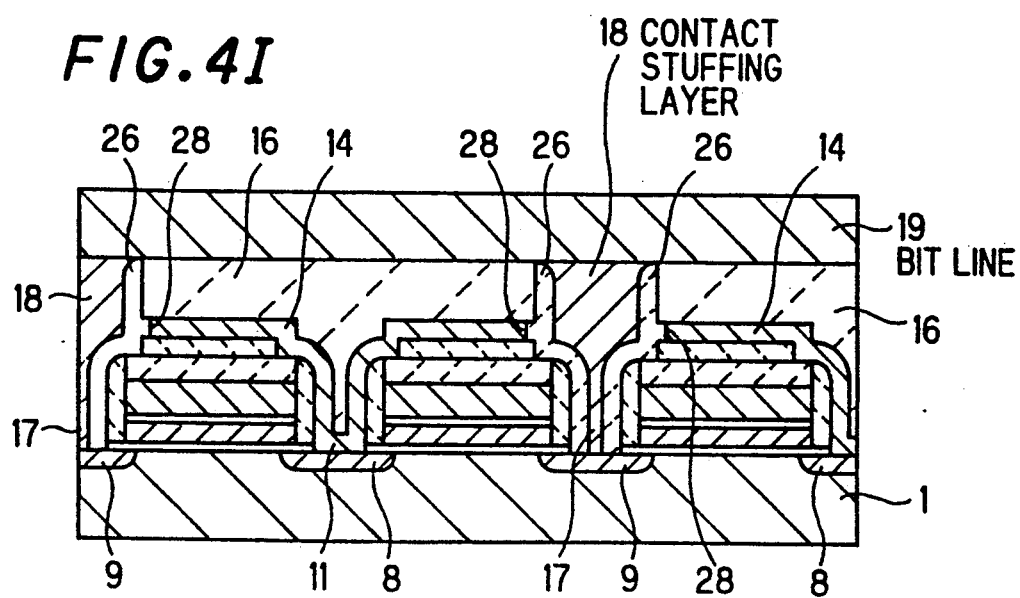

Then, as shown in FIG. 4G, a third interlayer insulation layer 25 is deposited to cover the surface of the fabricated semiconductor substrate 1 including the second interlayer insulation layer 16 and the opening of the bit contact 17. Then, as shown in FIG. 4H, anisotropic etching of the second interlayer insulation layer 25 is carried out to be etched back to form third side-wall insulation layers 26 on the side-walls of the gate electrode structures 7 and to widen the bit contact 17 to uncover the drain diffusion layer 9 through a self-alignment technique. Then, as shown in FIG. 4I, a contact stuffing layer 18 consisting of a conductive material such as tungsten is formed to stuff the bit contact 17, and then a bit line 19 is formed to be connected with the drain diffusion layer 9 through the contact stuffing layer 18.

In the first preferred embodiment, a pitch of contact patterns of the photo resist 22 in the direction parallel to the control gate electrodes 5 in the process of forming the bit contact 17 can be set to be $2\eta$ if the minimum size in design is defined as $\eta$. Therefore, the minimum patterning size of the cell in the direction parallel to the control gate electrode 5 becomes $2\eta$. It means that the minimum patterning size thereof becomes shortened by $\Delta\lambda + \Delta l + \delta$ as compared with that in the conventional non-volatile memory, because the minimum size of the cell in the conventional non-volatile memory in the direction parallel to the control gate electrode 5 is $2\eta + \Delta\lambda + \Delta l + \delta$. On the other hand, a pitch of the control gate electrodes 5 in the direction parallel to the bit line 19 can be set to be $2\eta$, so that there is no limitation of a gate length L of the control gate electrode 5 dependent on the sources line and the drain pads as in the conventional non-volatile memory. Additionally, there is an advantage in that a resistance of the source line is reduced in the non-volatile memory in the first preferred embodiment as compared with that in the conventional non-volatile memory by forming the source line to be a sheet-shaped one.

Figure 5:
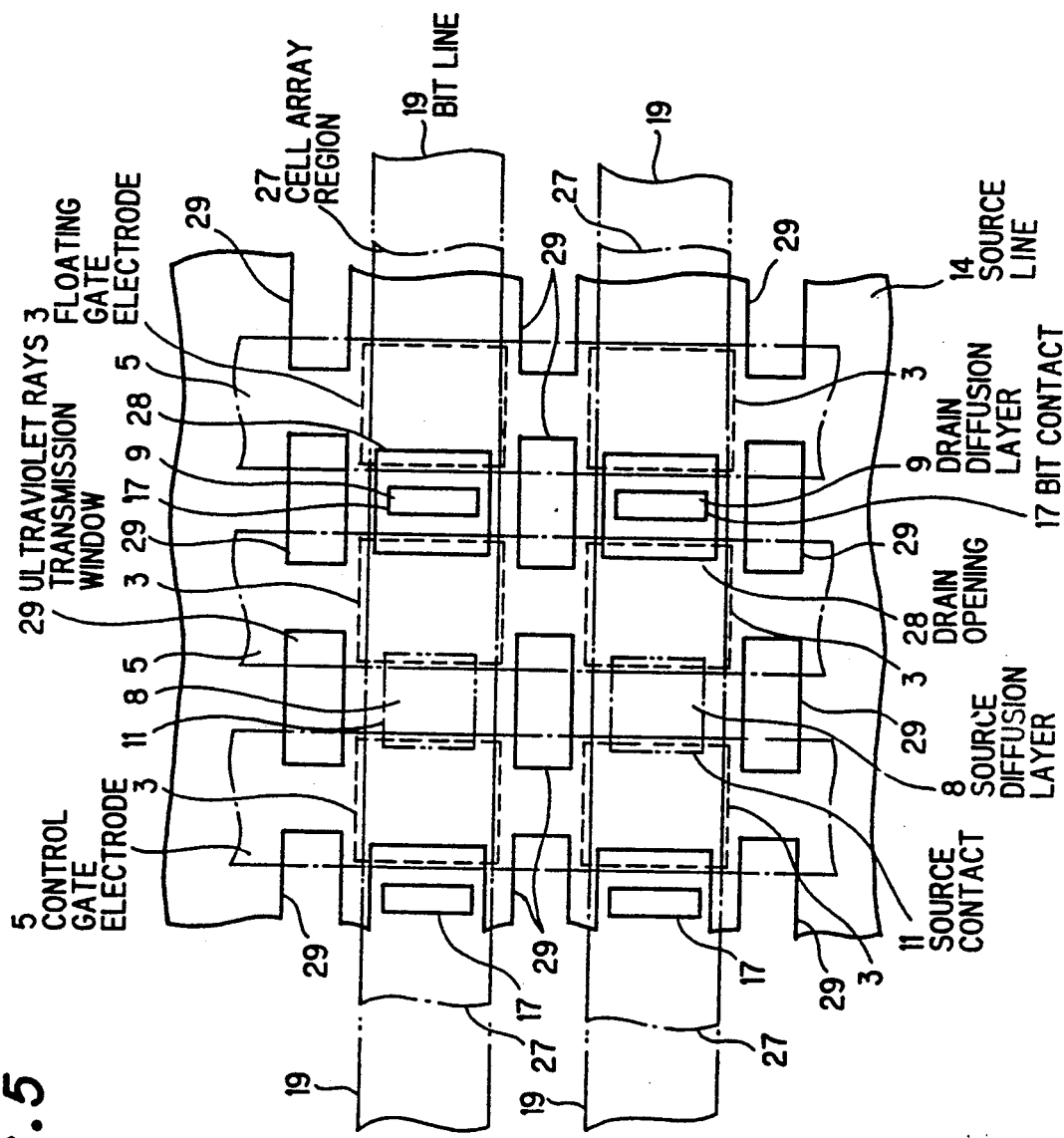
FIG. 5 is a plan view illustrating a schematic design of a non-volatile memory in a second preferred embodiment according to the invention.

Next, the non-volatile memory in the second preferred embodiment will be explained in conjunction with FIG. 5. The basic structure of the non-volatile memory in the second preferred embodiment is the same as that in FIG. 3, except that there is provided with a plurality of ultraviolet ray transmission windows 29 in a source line 14. The process for fabricating the non-volatile memory in the second preferred embodiment is also the same as that in FIGS. 2A to 2I, except that the ultraviolet ray transmission windows 29 are formed in the source line 14 after depositing the source line 14 as shown in FIG. 4D and then the second interlayer insulation layer 16 is deposited as shown in FIG. 2E. In this non-volatile memory, data written therein can be eliminated by applying ultraviolet rays, in distinction to the non-volatile memory in the first preferred embodiment, so that the non-volatile memory in the second preferred embodiment is suited for use in which it is necessary to rewrite data. The non-volatile memory in the first preferred embodiment is suited for use in which it is not necessary to rewrite data.

Although the invention has been described with respect to specific embodiment for complete and clear disclosure, the appended claims are not to thus limited and alternative constructions that may occur to one skilled in the art fall within the basic teaching herein set forth.

What is claimed is:

1. A non-volatile memory, comprising:
   a plurality of cell array regions arranged in parallel with each other, each of said cell array regions crossing a plurality of control gate electrodes and including
   a plurality of floating gate electrodes each positioned at each crossing point between said control gate electrodes and said cell array regions,
   a plurality of pairs of source diffusion layers and drain diffusion layers, each of said pairs positioned to bracket a control gate electrode, and
   source contacts each formed on a corresponding source diffusion layer by self-alignment via said control gate electrodes;
   a source line connected with each source diffusion layer through a source contact and having drain openings at each area of said drain diffusion layers;
   a plurality of bit contacts formed within said drain openings; and
   a plurality of bit lines arranged in parallel with said cell array regions, each bit line being connected with at least one drain diffusion layer through corresponding bit contacts.

2. A non-volatile memory, according to claim 1, wherein said source line is provided with a plurality of ultraviolet ray transmission windows.

* * * * *